United States Patent
Bosquez et al.

(10) Patent No.: US 6,522,938 B1
(45) Date of Patent: Feb. 18, 2003

(54) SYSTEM FOR TRACKING QUARTZWARE UTILIZATION IN SEMICONDUCTOR FABRICATION

(75) Inventors: Miguel E. Bosquez, Austin, TX (US); Misael Pecina, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/488,164

(22) Filed: Jan. 20, 2000

(51) Int. Cl.[7] .............................................. G06F 19/00
(52) U.S. Cl. ........................ 700/115; 700/121; 700/625
(58) Field of Search ................................ 700/121, 177, 700/175, 179, 106, 107, 108, 109; 423/275, 115, 593, 625, 107; 501/120, 127; 702/34

(56) References Cited

U.S. PATENT DOCUMENTS

| | | | |
|---|---|---|---|
| 5,216,612 A | * | 6/1993 | Cornett et al. ................. 700/96 |
| 5,746,591 A | * | 5/1998 | Yao ............................. 432/241 |
| 5,877,961 A | * | 3/1999 | Moore ......................... 345/835 |
| 6,225,602 B1 | * | 5/2001 | Buijze et al. ............... 118/50.1 |

* cited by examiner

Primary Examiner—Leo Picard
Assistant Examiner—Kidest Bahta
(74) Attorney, Agent, or Firm—Kevin L. Daffer; Conley, Rose & Tayon P.C.

(57) ABSTRACT

A system and storage medium for tracking quartzware utilization in vertical furnaces is provided. The system includes a computer server and a plurality of computer systems. The computer server maintains a database of quartzware inventory data and furnace data. The quartzware inventory data includes all relevant information about each piece of quartzware including a history of each piece of quartzware. The furnace data includes information about the part numbers of each piece of quartzware used for each vertical furnace. Program instructions are also stored on the computer server. The program allow personnel to access and modify information maintained in the database from any one of the plurality of computer systems. During servicing of a vertical furnace, the program displays each of the quartzware pieces that need to be changed. The program may also calculate statistical information relating to quartzware usage. The computer server may also be connected to an automated factory system such that the computer server may obtain a number of process cycles performed by a vertical furnace.

20 Claims, 3 Drawing Sheets

SYSTEM FOR TRACKING QUARTZWARE UTILIZATION IN SEMICONDUCTOR FABRICATION

BACKGROUND OF THE INVENTION

1. Field of the Invention

This invention relates to semiconductor processing and, more particularly, to a system and storage medium for tracking quartzware utilization in vertical furnaces.

2. Description of the Relevant Art

Vertical furnaces are used in semiconductor fabrication for forming a variety of thin films. The vertical furnaces may be used for thermal growth of oxides or for chemical vapor deposition of oxides, nitrides, and polysilicon. An example of a vertical furnace is the Alpha-8S manufactured by Tokyo Electron Limited of Tokyo, Japan. Vertical furnaces typically contain a large quantity of quartzware that must be cleaned and/or replaced on a regular basis. Failure to properly maintain the quartzware can result in the production of defective integrated circuits that result in increased manufacturing costs.

A single semiconductor fabrication facility typically may have twenty or more vertical furnaces. Each furnace may have more than seven different quartzware pieces. Additionally several spare pieces of each type of quartzware piece for each vertical furnace may be kept on site to ensure that an adequate supply of quartzware is always available. Each piece of quartzware may be new, clean, dirty, or no longer useable. It is critical to always have a complete set of replacement quartzware ready to go into every vertical furnace. If a vertical furnace starts producing defective integrated circuits, a typical solution is to replace the quartzware. If replacement quartzware is not available, the vertical furnace will not be available for manufacturing thereby increasing manufacturing costs. Additionally, during routine maintenance replacement quartzware needs to be on hand to replace any quartzware found to be defective or dirty. Also, after a certain amount of use, some pieces of quartzware are designed to be discarded.

Often the quartzware at a fabrication facility is not tracked with enough detail. For example, the method for tracking may not be easy to use resulting in not all personnel recording quartzware usage. Also all information about quartzware utilization is not always kept at a single location. Personnel may be required to dig through the inventory of quartzware in an attempt to determine if a certain type of quartzware is available or needs to be ordered from the manufacturer. If the correct type of quartzware cannot be found, valuable manufacturing time may be wasted. Additionally, personnel may have to dig through old notes to determine which quartzware needs to be removed from a vertical furnace. A piece of quartzware that needs to be removed may possibly be forgotten resulting in the failure of that quartzware and the possible production of an increased quantity of defective integrated circuits.

A specific piece of quartzware may result in an increased quantity of defective integrated circuits being produced due to, for example, an unnoticed defect. It may be difficult for personnel to dig through records in an attempt to correlate quartzware being used versus incident of production of defective integrated circuits to identify offending piece of quartzware.

It is therefore desired to develop a system for tracking the utilization of all quartzware used in all vertical furnaces. Such a system is preferably easy to use so that all personnel will record quartzware utilization information and maintains information about quartzware utilization at a single location. It is also desired that the system be able to indicate which pieces of quartzware need to be replaced during regularly scheduled maintenance. It is further desired to be able to easily view a history of each piece of quartzware.

SUMMARY OF THE INVENTION

The problems outlined above are in large part addressed by a system for tracking quartzware utilization in vertical furnaces. The system allows each piece of quartzware to be tracked. All relevant information about each piece of quartzware is kept in a single location allowing information about any specific piece of quartzware to be easily checked, however, the information can be accessed from a plurality of locations of which some of the locations are preferably near the point of use of the quartzware. Additionally, the system is easy to use so that personnel will be more likely to use the system. Information about each piece of quartzware can be viewed and modified from any computer system near vertical furnaces in which the quartzware is used. Such a system advantageously allows personnel to enter updated information about the quartzware on a timely basis thereby ensuring that all information about the quartzware is kept up to date.

A system including a computer server and a plurality of computer systems is contemplated herein. The computer server maintains a database of quartzware inventory data and furnace data. The quartzware inventory data includes all relevant information about each piece of quartzware including a history of each piece of quartzware. The furnace data includes information about the part numbers of each piece of quartzware used for each vertical furnace. Program instructions are also maintained on the computer server. This program allows personnel to access and modify information in the database from the plurality of computer systems. The computer systems are preferably located at a variety of sites including near the vertical furnaces in which the quartzware is used. Additionally, during servicing of a vertical furnace the program also displays each of the quartzware pieces that need to be changed. The program may also be able to calculate statistical information relating to quartzware usage. Additionally, the system may also be connected to an automated factory system. The program may allow the computer to connect to the automated factory system to determine a number of process cycles performed by a given vertical furnace.

A computer-readable storage medium is also contemplated herein. The storage medium contains program instructions that can be implemented by an execution unit such that quartzware utilization is tracked. The instructions allow data about each piece of quartzware to be viewed and modified. The instructions also determine the quartzware needed to be changed during maintenance of a vertical furnace. The instructions may also calculate statistical information relating to quartzware utilization. The storage medium additionally contains quartzware inventory data and furnace data.

BRIEF DESCRIPTION OF THE DRAWINGS

Other objects and advantages of the invention will become apparent upon reading the following detailed description and upon reference to the accompanying drawings in which.

Figure 1:
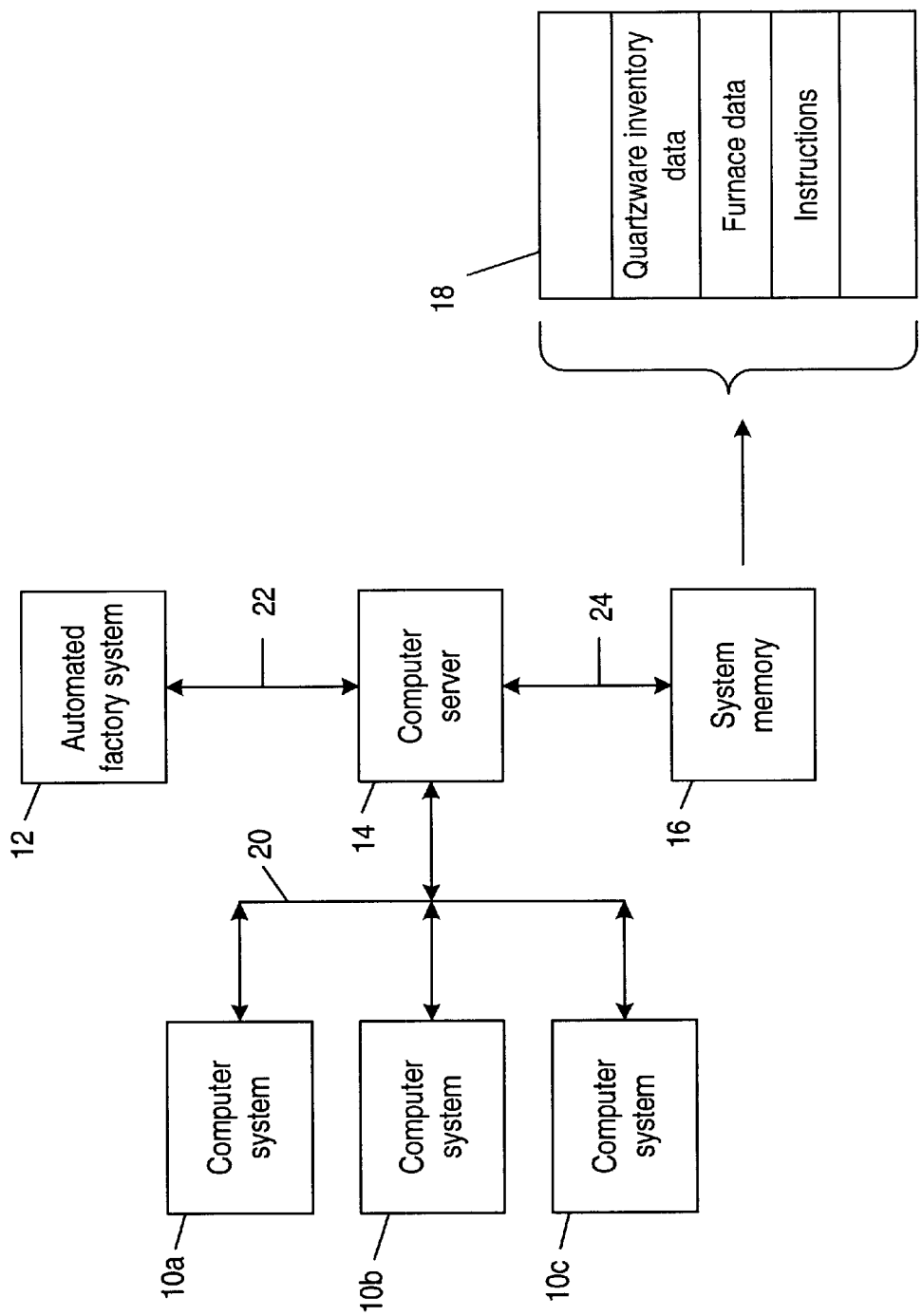
FIG. 1 is an exemplary block diagram of the interconnection of a computer server and computer system for maintaining an inventory of quartzware for a vertical furnace.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Turning now to the figures, FIG. 1 is an exemplary block diagram of the interconnection of a computer server and computer system for maintaining an inventory of quartzware for vertical furnaces. Computer systems 10 are shown connected to computer server 14 by network 20. Although three computer systems 10 are shown, there could be more than or, less than this quantity of computer systems. Automated factory system 12 is connected to computer server 14 by bus 12. Automated factory system 12 is connected to every process tool in the fabrication facility and controls the process flow of wafers throughout the fabrication facility. An example of an automated factory system is WorkStream™ sold by Consilium, Inc. of Mountain View, Calif. Computer server 14 is connected to system memory 16 by local bus 24. System memory 16 is either a volatile or non-volatile storage medium which may include a hard disk, a floppy disk, a read-only memory, and/or a random access memory in which data and instructions are stored. A portion of the information stored in system memory 16 is shown in memory address space 18. The information in memory address space 18 includes quartzware inventory data, furnace data, and instructions for displaying and modifying the data.

Personnel can access and add information to the data stored in memory address space 18 of computer server 14 using one of computer systems 10. The instructions located within memory address space 18 are executable on computer server 14 and computer systems 10. At least some of computer systems 10 are preferably located near each vertical furnace in which quartzware is used. Additionally, when the instructions in memory address space 18 are executed, they provide personnel with an easy to use interface that allows new information on the quartzware to be easily entered. In this way, new data on each piece of quartzware is more likely to be entered in a timely manner ensuring that the quartzware inventory data is kept up to date.

Figure 2:
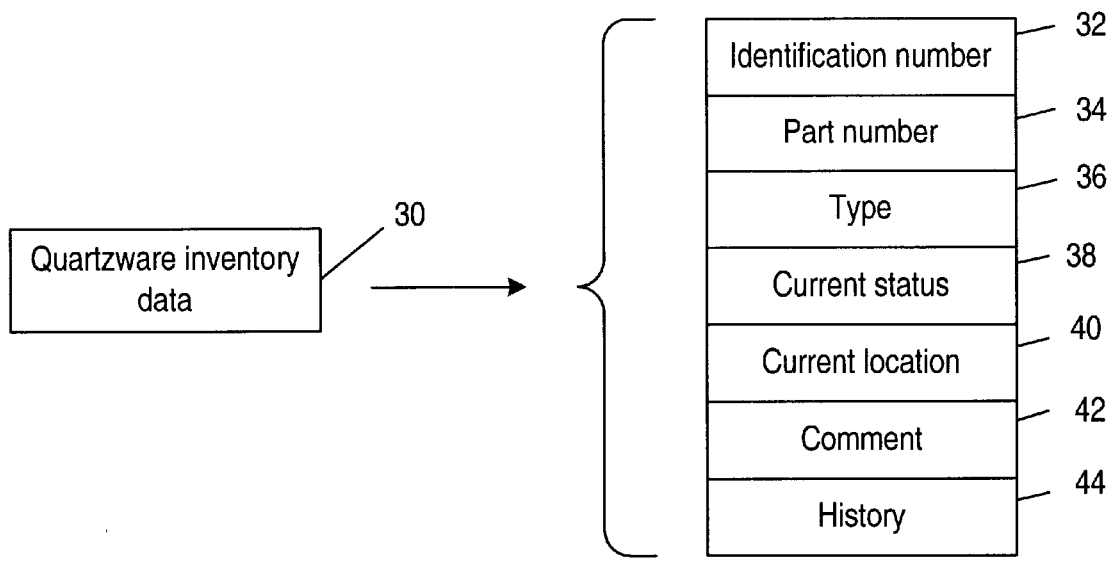
FIG. 2 is an exemplary block diagram of the information included in the quartzware inventory data.

The quartzware inventory data includes information on the quartzware used on every vertical furnace within a fabrication facility. The vertical furnaces may be used for oxidation, nitridation, and low-pressure chemical vapor deposition. The types of quartzware used within the vertical furnaces include tubes, liners, boats, pedestals, cap covers, manifold covers, and shutters. FIG. 2 shows the information included in the quartzware inventory data for each piece of quartzware. Quartzware inventory data 30 includes identification number 32, part number 34, type 36, current status 38, current location 40, comment 42, and history 44.

Identification number 32 is a unique identification number inscribed upon each piece of quartzware by the manufacturer. Part number 34 is the manufacturer's part number for the specific piece of quartzware. Type 36 is the process performed by the vertical furnace in which the quartzware is used. The different process performed by the vertical furnaces include high-temperature oxidation, low-temperature oxidation, gate oxidation, alloy oxidation, chemical vapor deposition of silicon dioxide using a TEOS source, chemical vapor deposition of polysilicon, and chemical vapor deposition of silicon nitride.

Figure 3:
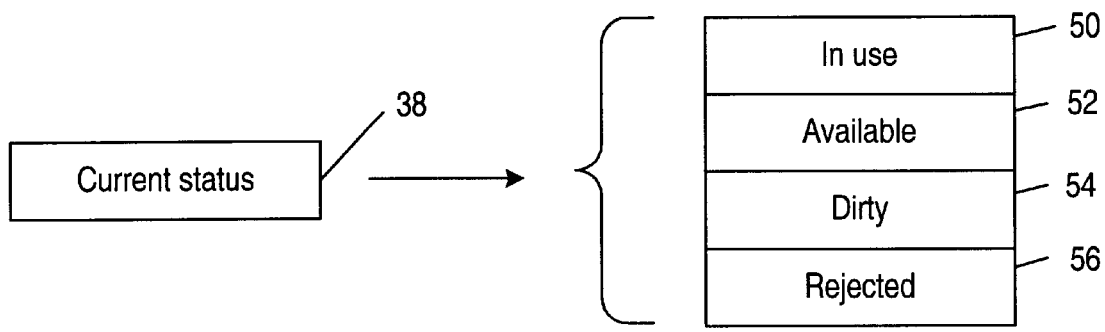
FIG. 3 is an exemplary block diagram of the possible statuses that may be included in the current status of each quartzware piece.

Current status 38 includes at least four different statuses of the quartzware, which are shown in FIG. 3. A first status is in use status 50 corresponding to the quartzware being inside one of the vertical furnaces. A second status is available status 52 corresponding to the quartzware being available for use. A third status is dirty status 54 corresponding to the quartzware not being in a vertical furnace but in need of cleaning before being available for use. A fourth status is rejected status 56 corresponding to the quartzware no longer being available for use due to, for example, damage or excessive age.

Current location 40 is where the quartzware is presently located. For example, if the quartzware is in use, the current location corresponds to the vertical furnace in which the quartzware is being used. Comment 42 is any comment entered about the quartzware by any personnel. For example, a brand new piece of quartzware may have the comment new. Whenever new information is entered about the quartzware, the old information is saved within history 44. History 44 may also contain information such a sink used to clean a piece of quartzware, the date and time at which the quartzware was cleaned, the personnel that cleaned the quartzware, the number of process cycles the quartzware has been exposed to, and the date and time the quartzware was installed or removed from a vertical furnace.

The furnace data includes information about the properties of each vertical furnace within the fabrication facility. The properties for each vertical furnace include the part numbers of every piece of quartzware used in the vertical furnace.

Figure 4:
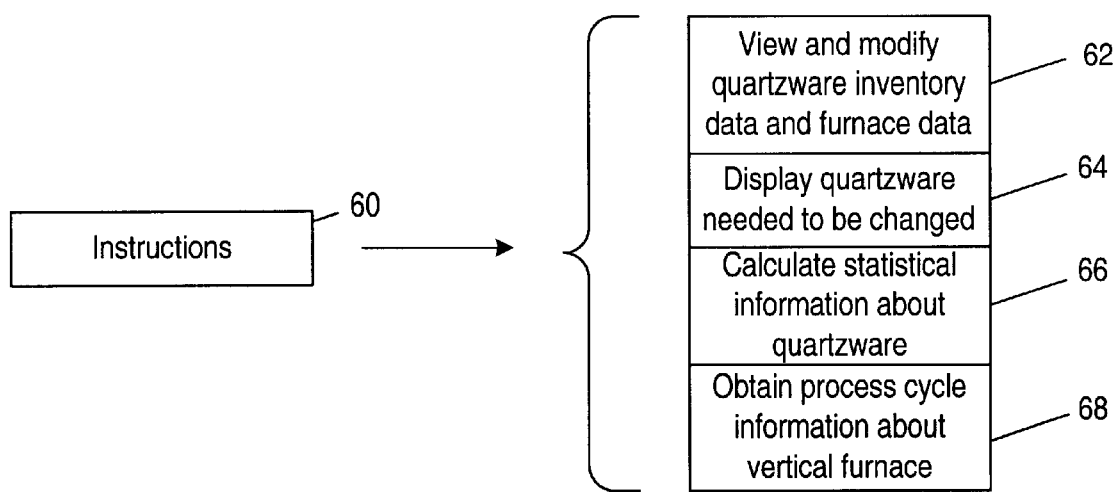
FIG. 4 is an exemplary block diagram of the various possible instructions included in the instructions stored in the system memory of the computer server.

At least four distinct instructions are included within the instructions located in memory address space 18, as shown in FIG. 4. Instructions 60 include: a first instruction 62 to view and modify the quartzware inventory data and the furnace data; a second instruction 64 to determine and display the quartzware needed to be changed in a vertical furnace; a third instruction 66 to calculate statistical information about the quartzware; and a fourth instruction 68 to obtain process cycle information about a vertical furnace from an automated factory system.

First instruction 62 allows personnel to view and modify quartzware inventory data and furnace data on any one of computer systems 10. All information for each piece of quartzware, such as that shown in FIG. 2, may be viewed or modified. Preferably, modifying the quartzware data can be done easily and quickly so that personnel are more likely to do it immediately and that the quartzware inventory data remains up to date. Examples of the type of information that can be viewed include a history of a specific piece of quartzware, a current location of a specific piece of quartzware, a quantity and status for quartzware having a particular part number, and the identification numbers of all quartzware in a specific vertical furnace. Additionally, all furnace data may also be viewed and modified. The furnace data includes the part numbers of each piece of quartzware used in every vertical furnace. When new quartzware pieces need to be ordered for a specific vertical furnace, the furnace data may be quickly viewed to determine the correct part numbers to give the manufacturer when ordering the pieces.

Second instruction 64 displays the quartzware needed to be changed in a vertical furnace. The quartzware may need to be changed in a vertical furnace due to regularly scheduled maintenance or due to the furnace producing an excessive number of defective integrated circuits. During a change of quartzware, each piece of quartzware that needs to be changed is displayed. Additionally, the location of suitable replacement quartzware that has an available status may also be displayed. For each piece of quartzware, the personnel may enter, while performing the quartzware change, if it was changed. If the quartzware is changed, personnel may also enter the identification number of the newly installed quartzware.

Third instruction 66 calculates statistical information about the quartzware based upon the information contained within the quartzware inventory data. The type of statistical information that can be calculated include an average number of process cycles performed by a vertical furnace between quartzware changes and a quantity of quartzware with a particular part, number used over a specific period of time. Such statistical information may allow personnel to help track the costs of operating the vertical furnaces.

Fourth instruction 68 may obtain process cycle information about a vertical furnace from an automated factory system. The process flow of wafers through a fabrication facility is controlled by an automated factory system. The number of process cycles performed by a given vertical furnace is important since regular maintenance of the quartzware within the vertical furnace is important for correct functioning of the vertical furnace. Automated factory systems typically maintain records of the number of process cycles performed by each tool. Fourth instruction 68 may be used by computer server 14 to communicate with automated factory system 12 and obtain the number of process cycles performed by a given vertical furnace. Instruction 68 may also use the process cycle information to determine a number of process cycles experienced by a given piece of quartzware and may also notify personnel when maintenance should be performed on a given vertical furnace.

It will be appreciated to those skilled in the art having the benefit of this disclosure that this invention is believed to provide a system and storage medium for tracking quartzware utilized in vertical furnaces. Further modifications and alternative embodiments of various aspects of the invention will be apparent to those skilled in the art in view of this description. For example, the quartzware tracking database could be maintained and accessible from a single computer system instead of a network of computer systems. It is intended that the following claims are interpreted to embrace all such modifications and changes and, accordingly, the specification and drawings are to be regarded in an illustrative rather than a restrictive sense.

What is claimed is:

1. A computer-readable storage medium having program instructions operable for tracking an inventory of quartzware for vertical furnaces, the storage medium comprising:

quartzware inventory data corresponding to a set of information for each piece of the quartzware;

furnace data corresponding to properties for each vertical furnace;

a first instruction that is adapted for viewing and modifying the quartzware inventory data and the furnace data; and a second instruction that is adapted for displaying the quartzware needed to be changed on one of the vertical furnaces.

2. The storage medium of claim 1, wherein the storage medium comprises a hard disk, a floppy disk, a read-only memory, and/or a random access memory.

3. The storage medium of claim 1, wherein the vertical furnaces are used for oxidation, nitridation, and low-pressure chemical vapor deposition.

4. The storage medium of claim 1, wherein the quartzware comprises tubes, liners, boats, pedestals, cap covers, manifold covers, and shutters.

5. The storage medium of claim 1, wherein the set of information for every piece of quartzware comprises:

an unique identification number, wherein the identification number is inscribed upon each piece of the quartzware;

a part number of the quartzware corresponding to the manufacturer's part number;

a type corresponding to a process performed by the vertical furnace in which the quartzware is used;

a current status of the quartzware;

a current location of the quartzware;

a comment; and a history of the quartzware.

6. The storage medium of claim 5, wherein the processes performed by the vertical furnaces comprise high-temperature oxidation, low-temperature oxidation, gate oxidation, alloy oxidation, chemical vapor deposition of silicon dioxide using a TEOS source, chemical vapor deposition of polysilicon, and chemical vapor deposition of silicon nitride.

7. The storage medium of claim 5, wherein the current status comprises:

an in use status corresponding to the quartzware being inside one of a plurality of the vertical furnaces;

an available status corresponding to the quartzware being ready for utilization;

a dirty status corresponding to the quartzware needing to be cleaned; and a rejected status corresponding to the quartzware no longer being available for use.

8. The storage medium of claim 1, wherein the properties for each vertical furnace comprise a part number for each piece of quartzware used in the vertical furnace.

9. The storage medium of claim 1, further comprising a third instruction that is adapted for calculating statistical information about the quartzware.

10. The storage medium of claim 9, wherein the statistical information comprises:

an average number of process cycles between quartzware changes; and a quantity of each type of quartzware used over a set time period.

11. The storage medium of claim 1, further comprising a fourth instruction that is adapted for fetching from an automated factory system a number of process cycles performed by one of the vertical furnaces.

12. A system for maintaining an inventory of quartzware for vertical furnaces, comprising:

a computer server;

a plurality of computer systems, wherein the computer server and the plurality of computer systems are networked together;

a database, stored within the computer server, adapted for maintaining records comprising inventory data for every piece of quartzware and properties for each vertical furnace;

a program, adapted for execution on the plurality of computer systems, to view and modify the inventory data and the properties for each vertical furnace and for displaying the quartzware need to be changed on one of the vertical furnaces.

13. The system of claim 12, wherein the quartzware comprises tubes, liners, boats, pedestals, cap covers, manifold covers, and shutters.

14. The system of claim 12, wherein the inventory data comprises:

an unique identification number, wherein the identification number is inscribed upon each piece of the quartzware;

a part number of the quartzware corresponding to the manufacturer's part number;

a type corresponding to a process performed by the vertical furnace in which the quartzware is used;

a current status of the quartzware;

a current location of the quartzware;

a comment; and a history of the quartzware.

15. The system of claim 14, wherein the processes performed by the vertical furnaces comprise high-temperature oxidation, low-temperature oxidation, gate oxidation, alloy oxidation, chemical vapor deposition of silicon dioxide using a TEOS source, chemical vapor deposition of polysilicon, and chemical vapor deposition of silicon nitride.

16. The system of claim 14, wherein the current status comprises:

an in use status corresponding to the quartzware being inside one of a plurality of the vertical furnaces;

an available status corresponding to the quartzware being ready for utilization;

a dirty status corresponding to the quartzware needing to be cleaned; and a rejected status corresponding to the quartzware no longer being available for use.

17. The system of claim 12, wherein the properties for each vertical furnace comprise a part number for each piece of quartzware used in the vertical furnace.

18. The system of claim 12, wherein the program is further adapted for calculating statistical information about the quartzware.

19. The system of claim 18, wherein the statistical information comprises:

an average number of process cycles between quartzware changes; and a quantity of each type of quartzware used over a set time period.

20. The system of claim 12, further comprising an automated factory system connected to the computer server, wherein the program is further adapted for fetching from an automated factory system a number of process cycles performed by one of the vertical furnaces.

* * * * *